(12) United States Patent
Posner et al.

(10) Patent No.: US 7,015,753 B2
(45) Date of Patent: Mar. 21, 2006

(54) DIGITAL SIGNAL PROCESSING BASED IMPLEMENTATION OF A FEED FORWARD AMPLIFIER

(75) Inventors: Richard D. Posner, Irvine, CA (US); James Beasley, Simi Valley, CA (US)

(73) Assignee: EDO Communications and Countermeasures Systems Inc., Simi Valley, CA (US)

( * ) Notice: Subject to any disclaimer, the term of this patent is extended or adjusted under 35 U.S.C. 154(b) by 80 days.

(21) Appl. No.: 10/859,392

(22) Filed: Jun. 2, 2004

(65) Prior Publication Data

US 2005/0012550 A1 Jan. 20, 2005

Related U.S. Application Data

(60) Provisional application No. 60/475,228, filed on Jun. 2, 2003.

(51) Int. Cl.
*H03F 1/26* (2006.01)

(52) U.S. Cl. ..................................................... 330/151
(58) Field of Classification Search ................ 330/151
See application file for complete search history.

(56) References Cited

U.S. PATENT DOCUMENTS

| | | | |
|---|---|---|---|
| 6,583,739 B1 * | 6/2003 | Kenington | 341/118 |
| 2004/0001559 A1 * | 1/2004 | Pinckley et al. | 375/297 |

* cited by examiner

*Primary Examiner*—Steven J. Mottola
(74) *Attorney, Agent, or Firm*—Gerald T. Bodner

(57) ABSTRACT

A digital signal processing based feed forward amplifier includes a delay circuit which receives a portion of the input signal and generates a delayed input signal. A first analog to digital converter receives another portion of the input signal and generates a digitized input signal. A main amplifier receives the delayed input signal and generates a main amplified signal. A second analog to digital converter receives at least a portion of the main amplified signal and converts it to a digitized main amplified signal. A digital signal processor receives the digitized input signal and the digitized main amplified signal and generates a digitized error signal. The digitized error signal is converted to an analog error signal by a digital to analog converter. An error amplifier receives the analog error signal and amplifies it to generate an amplified error signal. This error signal includes a noise and distortion component which is substantially the same in magnitude as the noise and distortion component of the main amplified signal. The amplified error signal and the main amplified signal are combined so that the noise and distortion components of each subtract, leaving substantially only the amplified desired signal component remaining in the amplified input signal, which is outputted by the feed forward amplifier. A third analog to digital converter converts a portion of the amplified error signal to a digitized amplified error signal, and a fourth analog to digital converter converts a portion of the output signal to a digitized output signal. The digitized output signal and the digitized amplified error signal are provided to the digital signal processor which generates the digitized error signal in response thereto.

9 Claims, 6 Drawing Sheets

DIGITAL SIGNAL PROCESSING BASED IMPLEMENTATION OF A FEED FORWARD AMPLIFIER

CROSS REFERENCE TO RELATED APPLICATION

This application claims the benefit of U.S. provisional patent application Ser. No. 60/475,228, filed on Jun. 2, 2003, and entitled "A DSP (Digital Signal Processing) Based Implementation of a Feed Forward Amplifier", the disclosure of which is incorporated herein by reference.

BACKGROUND OF THE INVENTION

1. Field of the Invention

This invention relates generally to distortion canceling techniques and more specifically relates to feed forward circuits and techniques for altering the amount of signal noise and distortion provided by amplifying devices.

2. Description of the Prior Art

Amplifiers are customarily used for enhancing electrical signals. However, a common problem associated with such signal enhancement is the addition of amplifier noise and distortion to the electrical signal. This is especially true when power amplifiers are utilized. Traditionally, feed forward circuits and techniques have been used to reduce the amount of signal noise and distortion generated by such amplifying devices.

It is well known that most applications that involve radiating power (through an antenna of some sort) require some degree of power amplification in order to overcome the inevitable space loss. It is also known that at higher power these power amplifiers are more likely to distort the signal in some way. Most of the modern transmission signals have limitations on how much distortion is permissible. Achieving power amplification which is cost effective, efficient (i.e., does not require a lot of external power), small sized, and achieves adequate linearity has become a challenge to modern designers of these devices.

There are many ways that the linearity requirements of a power amplifier are specified. Typical ones involve specifying the level of spectral distortion that can be tolerated (i.e., the amount of spurious signals outside the allocated bandwidth of the signal) or specifying the accuracy in vector space (i.e., monitoring the locus of the output voltage in amplitude and phase in vector space) in some fashion. Conventional feed forward power amplifiers utilize delay lines that typically are bulky and cause unneeded circuit loss.

In addition, feed forward power amplifiers are typically built as an assembly of modules that are mounted on a chassis or housing and are interconnected. Often exotic and costly substrates such as glass or ceramic loaded Teflon™ are utilized. It would be desirable to integrate a large portion, if not all, of a feed forward amplifier on a semiconductor substrate. Digital signal processing (DSP) offers a way of providing such an integration. DSP converts an analog signal to a digital signal, processes it, then may convert it back to an analog form. A limiting factor in DSP has been the speed of analog to digital conversion, and digital to analog conversion; however, recent technology has overcome these problems.

A signal being DSP processed can take advantage of a low-cost circuit typically utilizing digital gates, on a low cost substrate such as CMOS (Complementary Metal Oxide Semiconductor), to perform the same function previously done in analog form. Alternatively, a DSP may be implemented by a program running on a processor circuit. As a result of utilizing one of these techniques, the implementation will be smaller, more reliable and lower in cost. The present invention combines elements of feed forward amplifiers, digital pre-distortion amplifiers, and DSP techniques.

FIG. 1 is a block diagram of a conventional feed forward power amplifier. An example of two carriers (the desired signals) in the frequency domain is shown as they progress through the system. A portion of the input signal is coupled using a directional coupler 2 through the main amplifier path where its amplitude and phase are adjusted (Block 4) prior to amplification in the main power amplifier 6. The output of the main amplifier 6 is a greatly amplified version of the input signal and, in the process, is distorted. Shown in FIG. 1 are the third order intermodulation distortion (IMD) products around the two carrier signals. These are unwanted spurious signals.

In another path from the input, the unaltered input signal is delayed (Block 8) enough so as to match the delay through the main amplifier path. Then, in a coupler 10 or the like, the input signal is combined with a sample of the amplified input signal (taken with coupler 11) which is adjusted to have the same amplitude but is 180° out of phase such that the desired carrier signals cancel out. In practice, this is difficult to accomplish completely, but typical systems achieve 30 to 40 dB (decibels) of cancellation. What is expected to remain are the error signals which are the unwanted signal components (i.e., noise and distortion, including spurious signals). These are amplified (Block 12) in the correct phase and amplitude, and combined using a combiner 14 or the like out of phase with the signals from the main amplifier 6 which have been delayed (Block 16) to account for the delay in the error amplification process. The resultant output signal consists of the amplified desired signals and the unwanted signals which have been reduced by typically 20 –30 dB in the combining process.

FIGS. 2a and 2b are graphs which help explain how feed forward techniques achieve linearization. More specifically, FIG. 2a is a graph of the transfer curve of the main amplifier 6, with Vout, i.e., voltage out of a power amplifier with or without a pre-distorter circuit, as will be explained, as the ordinate, and Vin, i.e., voltage in to the power amplifier, with or without a pre-distortion circuit, as the abscissa. Plotted in the graph is the desired transfer curve, shown as a dashed line, the power amplifier actual transfer curve, and the output of the error amplifier 12 coupled onto the output of the power amplifier. FIG. 2b is a graph of superimposed signal spectrums, in the frequency domain, showing the desired signals, the intermodulation (IM) products on the output of the main amplifier 6, the ideal output of the error amplifier, and the ideal output of a feed forward amplifier when the error amplifier output is summed with the main amplifier output. These two figures are another way of viewing the feed forward process.

In FIG. 2a, the amplitude transfer function is shown, which typically compresses as the input signal drives the main amplifier closer to its saturation output power level where it is unable to develop any more power. The feed forward amplifier compensates for the lack of output power in the main amplifier 6 by adding in the difference between the desired linear output and the actual output from the main amplifier. This can be accomplished until the error amplifier 12 is unable to deliver enough difference power.

Typical feed forward amplifiers are able to amplify multiple signals with IM (intermodulation) levels down approximately 70 dBc. There can be, however, a number of issues with this approach.

First, because the high power output of the main amplifier 6 must be delayed, there is loss in the delay element. Low cost delay elements are delay lines which have higher loss than delay filters but the latter are expensive. Either delay element is also large to keep the loss low. Typical losses are 0.5 dB which means that ten percent (10%) of the power is lost.

Second, because the cancellation process is approximate, the amplified error signal contains a considerable amount of desired signal. Typically, the majority of the power in the error signal is in the desired signals. Thus, the error amplifier 12 must be large enough to amplify the undesired signals to levels high enough to cancel those in the main output signal but still have enough power capability not to saturate due to the amplified desired signals. As a result, the error amplifier 12 must be quite large and utilizes a lot of power, thus further reducing the efficiency of the overall amplifier.

Third, the ultimate efficiency of a feed forward amplifier is limited, based on the first and second reasons set forth above.

Fourth, in order to achieve the amount of required cancellation, the phase and gain and group delays of the two loops in a feed forward amplifier must be tightly controlled. Typical systems use fixed nominal values of delay, and control the phase and gain (Blocks 4 and 17), as shown in FIG. 2, with the monitoring circuits 18 and 20 and their associated couplers 22, 24, the first of which samples the unamplified error signal and the second of which samples the feed forward amplifier output signal. There are believed to be many patents covering techniques for controlling these loops. These correspond to various ways to inject "pilot" tones (inserted signals with known characteristics which are then cancelled in the loops), ways of adding modulation to the desired signal, ways of correlating the output with the desired signal, and the like. Most of these require some level of assumption on the stability of the system. For instance, a typical feed forward amplifier system "assumes" that the gain and phase linearity of the power amplifiers is reasonably controlled.

Fifth, as a result of the basic architecture and components required, feed forward amplifiers tend to be complex which affects their reliability and cost.

FIG. 3a shows a block diagram of a conventional digitally pre-distorted amplifier 28. Also shown in FIG. 3b is the transfer curve of the pre-distorter and the amplifier. These systems operate by inverting the transfer curve of the power amplifier such that the amplified output of the pre-distorter, when amplified by the power amplifier, develops the desired output signal. As shown, as the power amplifier gets closer to saturation, the output of the pre-distorter must "overcompensate" more and more to get the desired signal. Of course, there is no mechanism to develop more output power than can be delivered by the power amplifier output stage. By contrast, the feed forward amplifier can develop more output power than is available from the main amplifier since additional power is available from the error amplifier.

As shown, the digital pre-distorted amplifier operates by using a fixed algorithm to pre-distort the input signal. This algorithm is validated in an adaptive feedback loop, where a coupler 30 is used to sample the output signal of the amplifier 28, which signal is provided to an analog to digital converter 32, and the digitized sample signal is provided to the pre-distortion circuit 34. Thus, the adaptive feedback loop monitors the output of the amplifier 28 and makes non-real time updates to the algorithm. Various techniques are available for implementing the complex pre-distortion, but a typical one would involve a lookup table which monitors the input signal level and uses a lookup table to vary the output level and phase to achieve the desired inverse transfer characteristic of the power amplifier. The feedback system monitors a segment of the output signal and determines if the inverse curve is effective. If not, then the lookup table is varied somewhat to improve the match. Most digital pre-distortion systems characterize the AM-AM (amplitude modulation) and the AM-PM (phase modulation) characteristic of the amplifier. This recognizes that the major cause of distortion is the instantaneous amplitude of the input signal. Such causes the gain and the phase shift in the amplifier to vary (ideally, they would be constant over the input dynamic range). Another issue is "memory effect" which is so labeled because the status of the amplitude prior to the signal being amplified affects both the phase shift and the gain of the amplifier. A number of different causes for memory effect have been identified and a proper digital pre-distortion system recognizes the effect and attempts to compensate for it.

Typical digital pre-distorted power amplifiers do not achieve the level of performance of feed forward amplifiers. Typical numbers are IMD levels around −55 to −60 dBc. These amplifiers tend to have the following characteristics:

First, the efficiency tends to be higher than that achievable in a feed forward amplifier because they do not require the RF (radio frequency) output circuitry loss and the extra power dissipation in the error amplifiers.

Second, as noted, their level of spurious reduction is not as high as feed forward amplifiers. This is due to the difficulty in predicting the response of the power amplifier to all signals. Memory effect compensation tends to be accomplished by approximations, and the memory affect can vary with time, temperature, and frequency. A feed forward amplifier does not assume any distortion characteristics as it amplifies the error signals no matter what their source.

OBJECTS AND SUMMARY OF THE INVENTION

It is an object of the present invention to provide a feed forward amplifier using digital signal processing.

It is another object of the present invention to provide a feed forward amplifier which incorporates the elements of both digital pre-distortion and feed forward architecture in order to reduce the problems with both.

It is a further object of the present invention to provide a feed forward amplifier using digital signal processing which reduces the fabrication costs and increases the speed at which such a feed forward amplifier can operate.

It is yet another object of the present invention to provide a method for implementing a feed forward amplifier using digital signal processing techniques.

It is still a further object of the present invention to provide a DSP processed feed forward amplifier which takes advantage of low-cost circuitry typically utilizing digital gates to perform the same functions previously done in analog form.

In one form of the present invention, a digital signal processing based feed forward amplifier, which receives a substantially distortion free input signal and generates an amplified output signal in response thereto, which output signal includes the desired signal as well as undesired noise and distortion, includes a delay circuit and a first analog to digital converter. The delay circuit receives at least a portion of the input signal and generates a delayed input signal in response thereto. The first analog to digital converter receives another portion of the input signal and converts the input signal to a digitized input signal.

A main amplifier receives the delayed input signal and generates a main amplified signal in response thereto. The main amplified signal has a signal component and a noise and distortion component.

A second analog to digital converter receives at least a portion of the main amplified signal and converts that signal to a digitized main amplified signal. This digitized main amplified signal and the digitized input signal are provided to a digital signal processor. The digital signal processor generates a digitized error signal in response to the digitized input signal and the digitized main amplifier signal, as well as in response to other feedback loop signals, as will be described herein.

The digitized error signal is converted to an analog error signal by a digital to analog converter. The analog error signal is then provided to an error amplifier, which amplifies the analog error signal and generates an amplified error signal. The amplified error signal has a noise and distortion component which is substantially the same in magnitude as the noise and distortion component of the main amplified signal. The amplified error signal and the main amplified signal are combined in a combiner or the like such that the noise and distortion component of the amplified error signal is subtracted from the noise and distortion component of the main amplified signal, thereby leaving substantially only the amplified desired signal component remaining in the amplified input signal as an output signal of the feed forward amplifier.

A third analog to digital converter receives at least a portion of the amplified error signal and converts this signal to a digitized amplified error signal. This digitized amplified error signal is provided to the digital signal processor. A fourth analog to digital converter receives at least a portion of the output signal of the feed forward amplifier and converts this signal to a digitized output signal, which is also provided to the digital signal processor. The digital signal processor, in response to the digitized output signal and the digitized amplified error signal, as well as the digitized main amplified signal and the digitized input signal mentioned previously, generates the error signal which is used to cancel the noise and distortion component attributable to the main amplifier, leaving only the desired signal component on the output signal of the feed forward amplifier.

These and other objects, features and advantages of the present invention will be apparent from the following detailed description of illustrative embodiments thereof, which is to be read in connection with the accompanying drawings.

DETAILED DESCRIPTION OF THE PREFERRED EMBODIMENTS

The present invention combines elements of feed forward amplifiers, digital pre-distortion amplifiers and digital signal processing (DSP) techniques. The present invention offers a number of improvements to conventional feed forward power amplifier architecture. The circuitry and methodology of the present invention involve manipulating digital signals derived from RF (radio frequency) frequencies so as to simulate the distortion in a main amplifier. The distortion signal is then amplified in an error amplifier and subtracted from the output of the main amplifier to leave the desired signal. The circuitry and methodology of the present invention incorporate elements of both digital pre-distortion and feed forward architecture in order to reduce the problems with both and to take advantage of the great strides that have been made in digital signal processing both in cost and speed.

Figure 4:
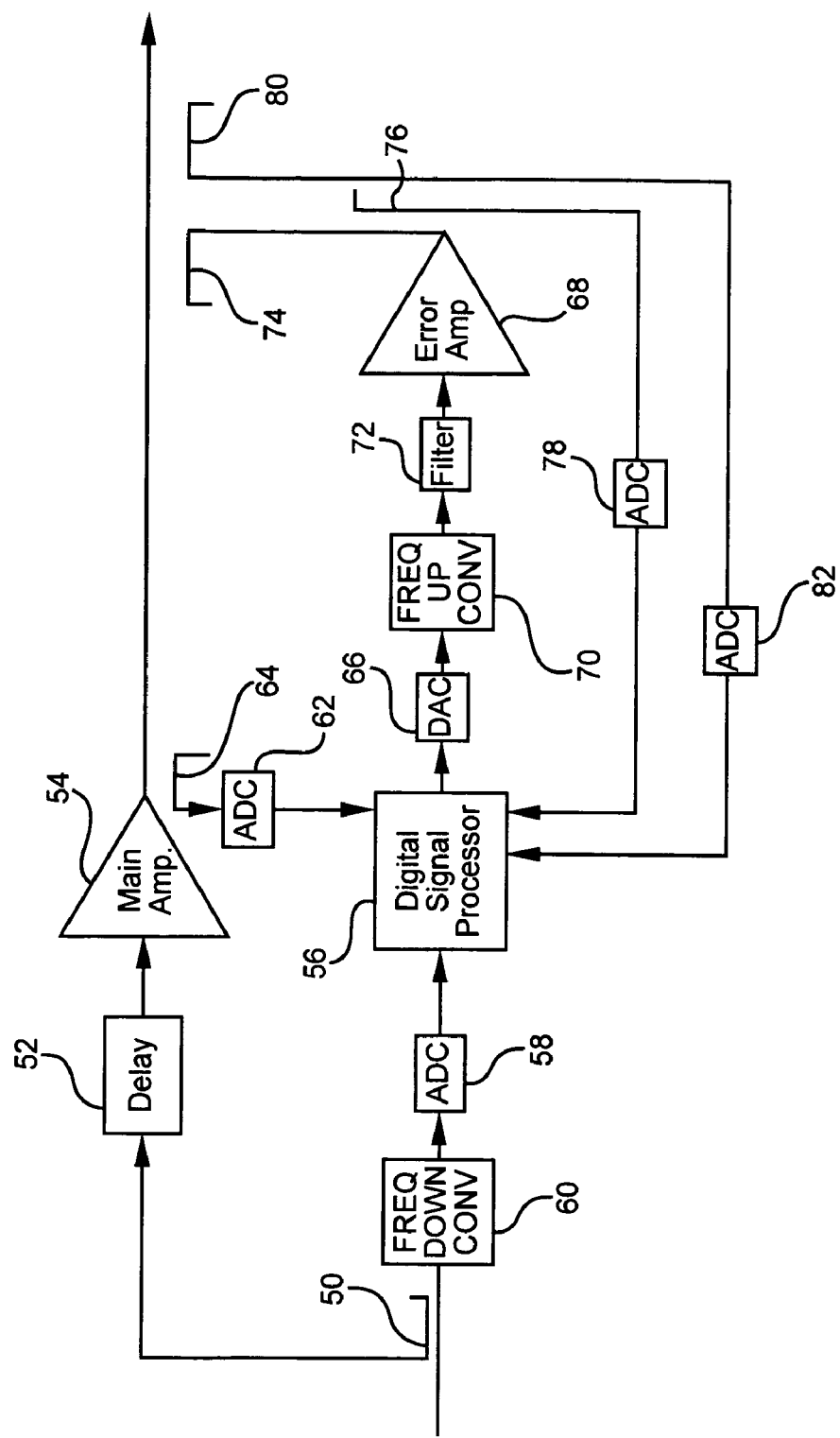
FIG. 4 is a block diagram of a feed forward power amplifier formed in accordance with one form of the present invention.

Turning initially to FIG. 4 of the drawings, one embodiment of a feed forward amplifier formed in accordance with the present invention is shown in block diagram form. The input signal is split using a directional coupler 50, splitter, hybrid or the like (herein collectively referred to as "directional coupler") into two portions. The first portion of the input signal is provided to a delay circuit 52 before it is inputted to the main amplifier 54. The delay circuit 52 provides a delay to the input signal and generates a delayed input signal in response thereto. This delay could be significant. If it becomes impractical for an analog delay line, then, in an alternate embodiment, the input signal would be digitized using an analog to digital converter (not shown), and then digitally delayed in a digital delay circuit (not shown), and the delayed signal is provided to a digital to analog converter (not shown), before it is provided to the main amplifier 54.

As shown in FIG. 4, and as will be explained in greater detail, the feed forward amplifier of the present invention uses a digital signal processor (DSP) 56. Thus, the inputs to the DSP 56 must be digitized using analog to digital converters, as also will be described in greater detail. The DSP 56 may be implemented using discrete circuits, a microprocessor, software or a combination of any of these, as is well known in the art. The DSP takes advantage of low-cost circuitry typically utilizing digital gates, on a low cost substrate such as CMOS, to perform functions which are previously performed in analog form. Alternatively, digital signal processing may be implemented by a program running on a processor circuit. As a result of utilizing one or more of these techniques, the implementation of a digital signal processing based feed forward amplifier will be smaller, more reliable and lower in cost.

Another portion of the input signal, which is substantially distortion free, is provided to a first analog to digital converter 58. The first analog to digital converter 58 converts the input signal to a digitized input signal before it is provided to the digital signal processor 56.

The feed forward amplifier of the present invention includes a main amplifier 54. The main amplifier 54 receives the delayed input signal and generates a main amplified signal in response thereto. In amplifying the delayed input signal, the main amplifier 54 adds a noise and distortion component to the signal component on its output signal, i.e., the main amplified signal.

In practicality, an RF frequency down converter 60 is used in the circuit and interposed between the first directional coupler 50, which splits the input signal, and the first analog to digital converter 58. The frequency down converter 60 is preferably used to bring the frequency of the input signal to within the frequency range of cost effective analog to digital converters. Thus, the frequency down converter 60, if used, receives the input signal and down converts the frequency thereof to a frequency which is compatible to the first analog to digital converter 58, and generates a down converted input signal which is provided to the first analog to digital converter. The first analog to digital converter 58 is responsive to the down converted input signal and generates the digitized input signal in response thereto.

A second analog to digital converter 62 receives a sample of the main amplified signal from the main amplifier through a second directional coupler 64 and converts this sample signal into a digitized main amplified signal. The digitized main amplified signal is provided to the digital signal processor 56. If desired, another RF frequency down converter (not shown) may be used between coupler 64 and analog to digital converter 62.

The digital signal processor 56 receives, among other signals, the digitized input signal from the first analog to digital converter 58 and the digitized main amplified signal from the second analog to digital converter 62, and generates a digitized error signal in response to these signals as well as others which will be described in greater detail. The digitized error signal includes a digitized noise and distortion component.

A digital to analog converter 66 is connected to the digital signal processor 56 and receives the digitized error signal from the processor. The digital to analog converter 66 converts the digitized error signal to an analog error signal which will be used in canceling the noise and distortion component added by the main amplifier 54 to the amplified signal.

The analog error signal is preferably provided to an error amplifier 68. The error amplifier 68 receives the analog error signal and amplifies it in order to generate an amplified error signal on its output. The amplified error signal has a noise and distortion component which is substantially the same in magnitude as the noise and distortion component of the main amplified signal.

If it is desired to use an inexpensive digital to analog converter, working at a lower frequency range, then an RF frequency up converter 70 is preferably interposed between the output of the digital to analog converter 66 and the input of the error amplifier 68. The frequency up converter 70 would receive the analog error signal and up convert the frequency thereof to a frequency corresponding to that of the input signal, and generates an up converted error signal in response thereto. The up converted error signal is provided to the error amplifier 68 which amplifies the up converted error signal to generate the amplified error signal.

Optionally, but preferably, a filter 72 is interposed between the output of the digital to analog converter 66 and the input of the error amplifier 68. The filter 72 eliminates any out of band signals that are not within the targeted range of signals (which includes the spurious signals, noise and distortion generated by the main amplifier 54, as well as the desired signals) before they are passed to the error amplifier 68. Thus, the filter circuit 72 receives the analog error signal from the digital to analog converter 66, or the up converted error signal from the frequency up converter 70, if such is included, filters the same, and generates a filtered up converted error signal or filtered analog error signal, and provides the same to the error amplifier 68 so that the error amplifier generates the amplified error signal therefrom.

The amplified error signal generated by the error amplifier and the main amplified signal are combined in a third directional coupler 74 or the like such that the noise and distortion component of the amplified error signal is subtracted from the noise and distortion component of the main amplified signal, thereby leaving substantially only the amplified signal component remaining in the amplified input signal. Thus, noise and distortion are cancelled from the amplified input signal, and this signal is provided as the output signal of the feed forward amplifier.

Feedback loops are provided in the feed forward amplifier of the present invention in order to monitor the cancellation of the noise and distortion component, including other spurious signals, of the output signal. In particular, an error signal feedback loop and an output signal feedback loop are provided using additional directional couplers and analog to digital converters.

Even more specifically, a third directional coupler 76 or the like is used to sample the amplified error signal from the output of the error amplifier 68, which sample signal is provided to the input of a third analog to digital converter 78, or first to a frequency down converter (not shown) and then to the third analog to digital converter 78, if such frequency down converter is desired. The third analog to digital converter 78 converts the sample amplified error signal and converts it to a digitized amplified error signal, which is provided to the digital signal processor 56.

Additionally, a fourth directional coupler 80 or the like is used to sample the feed forward amplifier output signal, and this sample signal is provided to a fourth analog to digital converter 82, or optionally, first to a further frequency down converter (not shown) and then to the fourth analog to digital converter 82, if such frequency down converter is desired. The fourth analog to digital converter 82 converts this sample signal of the output signal to a digitized output signal and provides the digitized output signal to the digital signal processor 56. The digital signal processor 56 adjusts the digitized error signal it generates in phase, amplitude and delay, as required, in response to the digitized amplified error signal and the digitized output signal.

Figure 5:
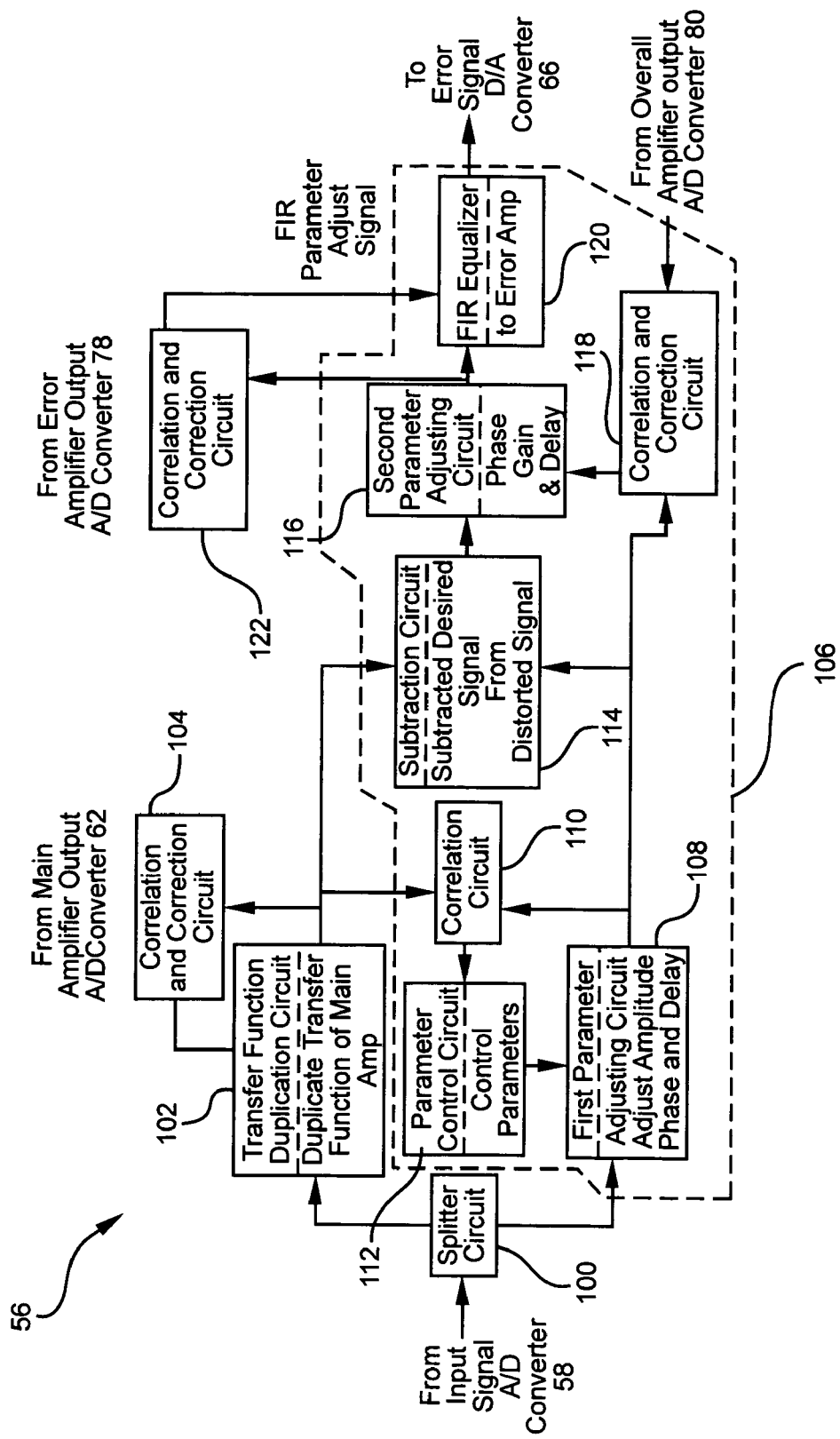
FIG. 5 is a block diagram of the digital signal processor of the feed forward amplifier of the present invention shown in FIG. 4.

FIG. 5 illustrates in block diagram form the preferred components of the digital signal processor 56 as well as the steps used in the digital processing technique of the feed forward amplifier of the present invention. At the input of the digital signal processor which receives the digitized input signal from the first analog to digital converter 58, the digitized input signal is split using a splitter circuit 100 or the like into two paths. The first path includes a transfer function duplication circuit 102 which effectively duplicates the transfer function of the main amplifier 54. The duplication circuit output signal is correlated with the digitized main amplified signal provided by the second analog to digital converter 62 in a correlation and correction circuit 104, and corrected if necessary, by an output signal provided to the transfer function duplication circuit 102 by the correlation and correction circuit 104. The other path of the split input signal leads to an equalizer circuit 106.

More specifically, the digitized input signal from the first analog to digital converter 58 passes through the splitter circuit 100 to a first parameter adjusting circuit 108. The first parameter adjusting circuit 108 generates an adjusted digitized input signal in response thereto, which signal corresponds to the input signal adjusted in amplitude, phase and delay, as required.

The adjusted digitized input signal is provided to another correlation circuit 110 and is correlated with the output signal of the transfer function duplication circuit 102, which correlation circuit 110 provides a correlation signal to a parameter control circuit 112 which, in turn, outputs a signal to the first parameter adjusting circuit 108 to adjust the amplitude, phase and delay of the adjusted digitized input signal provided thereto.

The digital signal processor 56 of the feed forward amplifier further includes a subtraction circuit 114. The subtraction circuit 114 receives the output signal of the transfer function duplication circuit 102 and the adjusted digitized input signal from the first parameter adjusting circuit 108, and subtracts the adjusted digitized input signal from the duplication circuit output signal to generate a preliminary digitized error signal. This preliminary digitized error signal is provided to a second parameter adjusting circuit 116.

The second parameter adjusting circuit 116 receives the preliminary error signal and the digitized output signal generated by the fourth analog to digital converter 82. Even more preferably, the digitized output signal from the fourth analog to digital converter 82 is provided to another correlation circuit 118, and is correlated with the adjusted digitized input signal generated by the first parameter adjusting circuit 108, and is corrected as necessary. The output of this correlation circuit 118 is provided to the second parameter adjusting circuit 116 which adjusts the amplitude, phase and delay of the preliminary error signal and generates an adjusted preliminary error signal. In one form of the present invention, the adjusted preliminary error signal is provided to the digital to analog converter 66, and the digital to analog converter generates the analog error signal in response thereto.

In an even more preferred embodiment of the present invention, the equalizer circuit 106 of the digital signal processor 56 may further include a finite impulse response (FIR) equalizer 120. The FIR equalizer 120 receives the adjusted preliminary error signal, which is also provided to a further correlation circuit 122 and is correlated with the digitized amplified error signal from the third analog to digital converter 78, and is corrected as necessary, the correlation circuit 122 providing an FIR parameter adjust signal to the FIR equalizer 120. The FIR equalizer 120 equalizes the adjusted preliminary error signal and generates an FIR equalized error signal that is provided to the digital to analog converter 66. The digital to analog converter is responsive to the FIR equalized error signal and generates the analog error signal in response thereto.

The basic steps in performing the digital processing shown in FIG. 5 will now be summarily described. The input signal, as stated previously, splits two ways, with one way going through the circuit 106 which equalizes the through signal path in gain, phase and delay, and preferably would include the FIR equalizer 120. The other path goes through a function circuit which duplicates the expected performance of the main amplifier 54. These output signals would be correlated, and the through path equalization adjusted to eliminate the desired signal from the amplified signal when subtracted from one another. This error signal goes through another set of adjustments and is equalized to the response of the error amplifier 68 prior to the digital output.

The inputs to the digital signal processor 56 from the rest of the feed forward amplifier circuit are shown in FIG. 5 and are utilized to set the parameters of the digital signal processor. The parameters of the path duplicating the distortion of the main amplifier 54 is adjusted by monitoring the performance of the main amplifier on a periodic basis. The AM-AM and AM-PM curves as well as the memory effect would be maintained and compared with the performance of the simulation. Also, the phase, gain and delay response of the error amplifier 68 are monitored and used to control the error drive signal.

Figure 6:
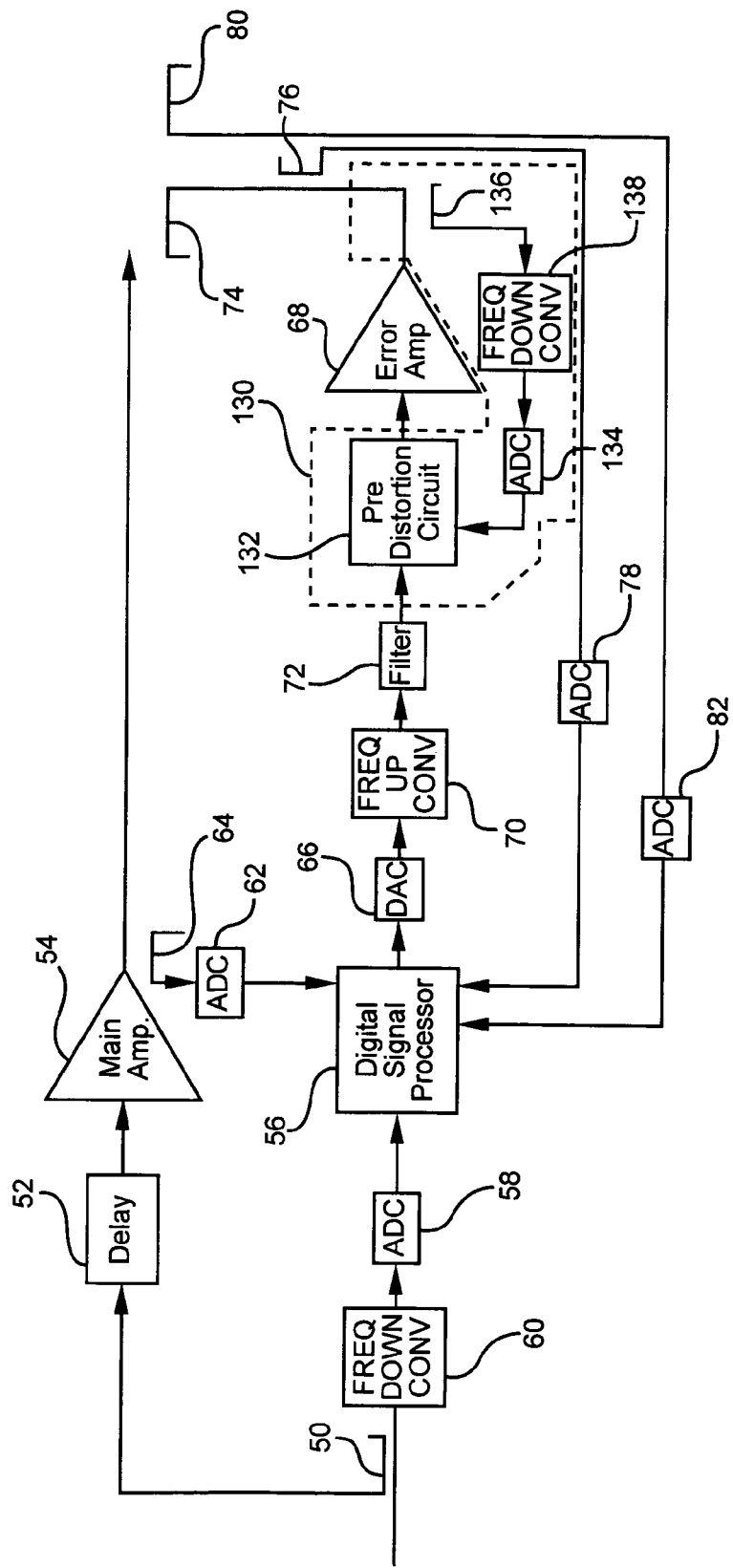
FIG. 6 is a block diagram of a feed forward amplifier formed in accordance with a second form of the present invention.

An alternative embodiment of the feed forward amplifier of the present invention is shown in FIG. 6 of the drawings. It is similar in many respects to the feed forward amplifier of the present invention shown in FIG. 4, but further includes a pre-distorter 130, which is included to drive the error amplifier 68 so as to increase the accuracy of the injected error signal.

More specifically, the pre-distorter 130 includes a pre-distortion circuit 132. The pre-distortion circuit 132 is interposed between the digital to analog converter 66 and the error amplifier 68, or between the frequency up converter 70 and the filter 72, or between the filter 72 and the error amplifier 68, if such optional components are included.

Figure 1:
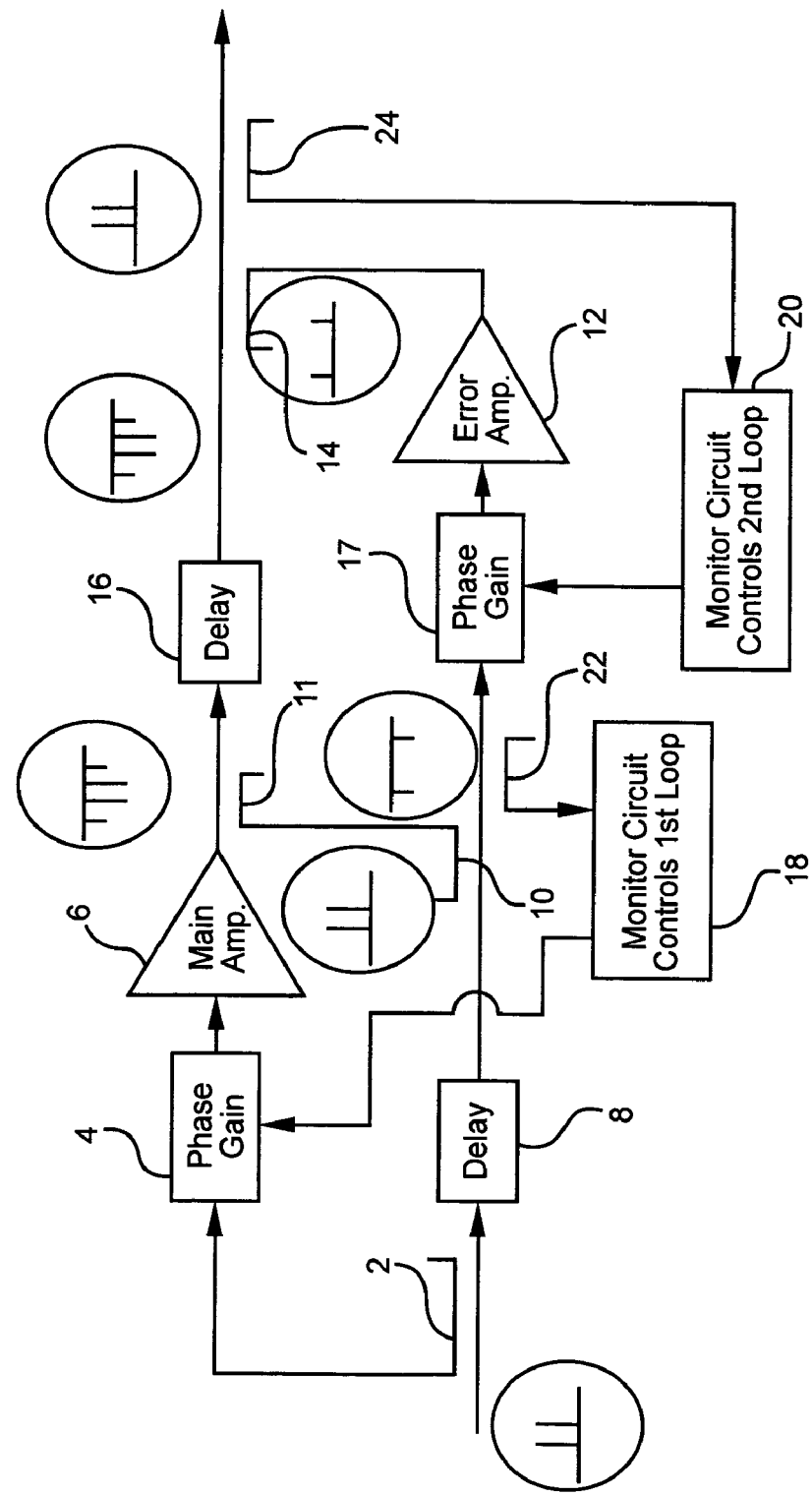
FIG. 1 is a block diagram of a conventional feed forward power amplifier.
Figure 2B:
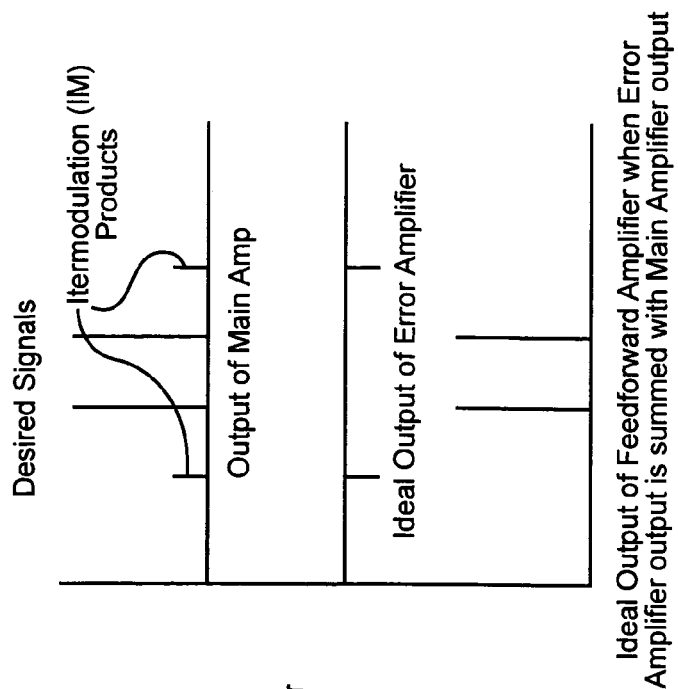
FIG. 2b is a graph showing various signals generated by the components of a conventional feed forward amplifier.
Figure 2A:
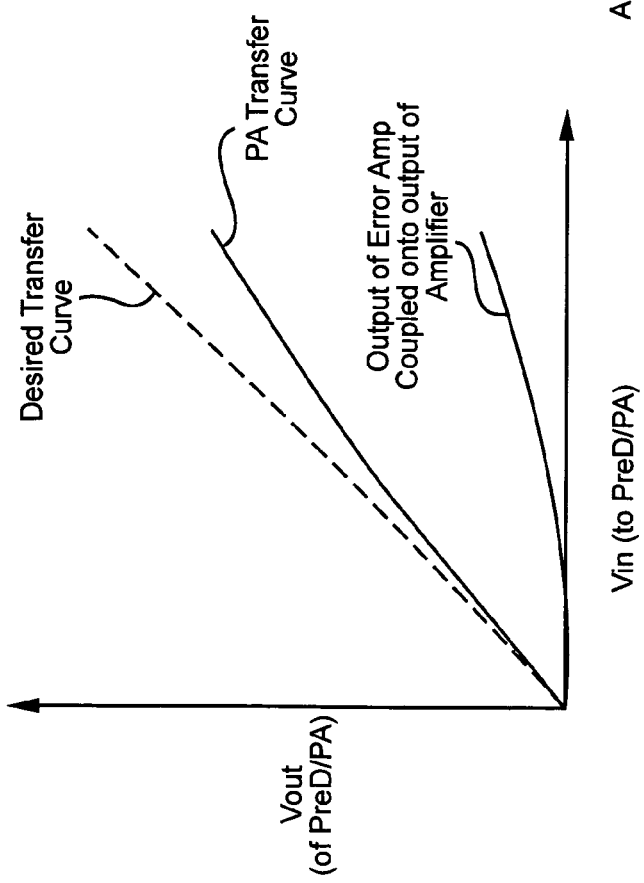
FIG. 2a is a graph of the transfer curve of a conventional feed forward amplifier, with the output signal of the amplifier, in voltage, plotted against the input signal to the amplifier, also in voltage.
Figure 3B:
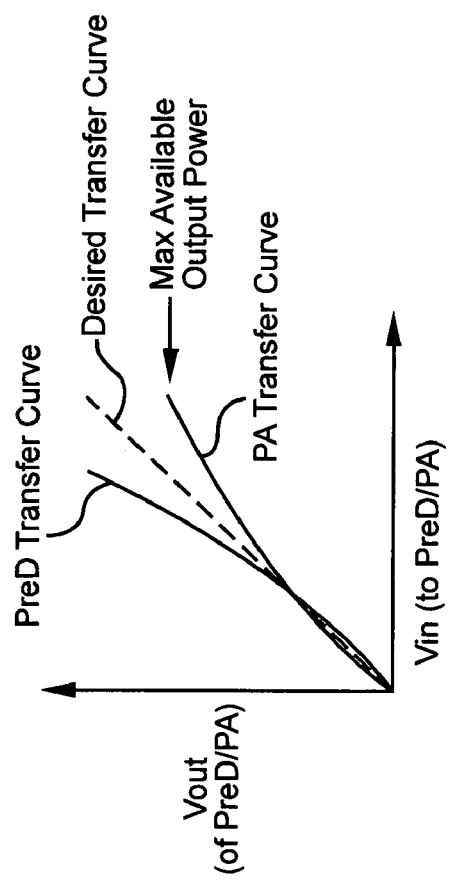
FIG. 3b is a graph showing the transfer curve of the amplifier shown in FIG. 3a with a pre-distortion circuit connected thereto, and with the output signal of the amplifier, in voltage, plotted against the input signal to the amplifier, also in voltage.
Figure 3A:
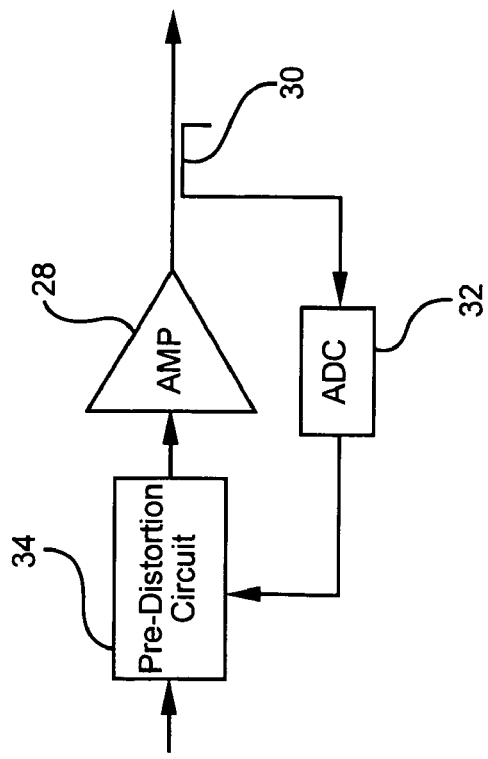
FIG. 3a is a block diagram of a conventional digital pre-distortion circuit used for linearizing a power amplifier.

The pre-distorter 130 also includes a fifth analog to digital converter 134. The fifth analog to digital converter 134 receives a sample of the amplified error signal through another directional coupler 136 and converts the sampled amplified error signal to a digitized amplified error signal. If necessary, a frequency down converter 138 may be used and interposed between the directional coupler 136 and the input of the fifth analog to digital converter 134 to down convert the sampled amplified error signal to one which is compatible to and within the frequency range of the fifth analog to digital converter. The fifth analog to digital converter 134 provides its outputted digitized amplified error signal to the pre-distortion circuit 132. The pre-distortion circuit 132 pre-distorts the analog error signal in the same manner as a conventional pre-distorter, such as that described previously and shown in FIGS. 3a and 3b.

The digital signal processing based feed forward amplifier of the present invention provides a cost effective, accurate and relatively fast feed forward amplifier with a linearized transfer function and with minimal distortion, noise and spurious signals. By having the circuit monitor the output signal of the overall feed forward amplifier, the technique described herein provides IM (intermodulation) rejection commensurate with or better than that of a typical feed forward amplifier. The feed forward amplifier of the present invention may be integrated, to a large degree, on a semiconductor substrate in a cost effective manner. The implementation of the present invention, by using the techniques described, will be smaller, more reliable and lower in cost than conventional feed forward amplifiers.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A digital signal processing based feed forward amplifier, which comprises:
   a first directional coupler, the first directional coupler being responsive to an input signal and generating a first signal and a second signal in response thereto;
   a delay circuit, the delay circuit being responsive to the first signal and generating a third signal in response thereto;
   a main amplifier, the main amplifier being responsive to the third signal and generating a fourth signal in response thereto;
   a second directional coupler, the second directional coupler being responsive to the fourth signal and generating a fifth signal and a sixth signal in response thereto;
   a first analog to digital converter, the first analog to digital converter being responsive to the second signal and generating a seventh signal in response thereto;
   a second analog to digital converter, the second analog to digital converter being responsive to the sixth signal and generating an eighth signal in response thereto;
   a digital signal processor, the digital signal processor being at least partially responsive to the seventh signal and the eighth signal and generating a ninth signal in response thereto;
   a digital to analog converter, the digital to analog converter being responsive to the ninth signal and generating a tenth signal in response thereto;
   an error amplifier, the error amplifier being responsive to the tenth signal and generating an eleventh signal in response thereto;
   a third directional coupler, the third directional coupler being responsive to the eleventh signal and generating a twelfth signal and a thirteenth signal in response thereto;
   a fourth directional coupler, the fourth directional coupler being responsive to the fifth signal and the twelfth signal and generating a fourteenth signal in response thereto;
   a fifth directional coupler, the fifth directional coupler being responsive to the fourteenth signal and generating a fifteenth signal and an output signal in response thereto;
   a third analog to digital converter, the third analog to digital converter being responsive to the thirteenth signal and generating a sixteenth signal in response thereto; and
   a fourth analog to digital converter, the fourth analog to digital converter being responsive to the fifteenth signal and generating a seventeenth signal in response thereto, the digital signal processor being at least partially responsive to the sixteenth signal and the seventeenth signal and generating the ninth signal in response thereto.

2. A digital signal processing based feed forward amplifier which receives an input signal and generates an amplified output signal in response thereto, which comprises:
   a delay circuit, the delay circuit receiving at least a first portion of the input signal and generating a delayed input signal in response thereto;
   a first analog to digital converter, the first analog to digital converter receiving at least a second portion of the input signal and converting the at least second portion of the input signal and converting the at least second portion of the input signal to a digitized input signal;
   a main amplifier, the main amplifier receiving the delayed input signal and generating a main amplified signal in response thereto, the main amplified signal having a signal component and a noise and distortion component;
   a second analog to digital converter, the second analog to digital converter receiving at least a portion of the main amplified signal and converting the at least a portion of main amplified signal to a digitized main amplified signal;
   a digital signal processor, the digital signal processor receiving at least the digitized input signal and the digitized main amplifier signal and generating a digitized error signal at least partially in response thereto;
   a digital to analog converter, the digital to analog converter receiving the digitized error signal and converting the digitized error signal to an analog error signal;
   an error amplifier, the error amplifier receiving the analog error signal and amplifying the analog error signal to generate an amplified error signal, the amplified error signal having a noise and distortion component which is substantially the same in magnitude as the noise and distortion component of the main amplified signal, the amplified error signal and the main amplified signal being combined such that the noise and distortion component of the amplified error signal is subtracted from the noise and distortion component of the main amplified signal thereby leaving substantially only the amplified signal component remaining in the amplified input signal as an output signal of the feed forward amplifier;
   a third analog to digital converter, the third analog to digital converter receiving at least a portion of the amplified error signal and converting the at least a portion of the amplified error signal to a digitized amplified error signal; and
   a fourth analog to digital converter, the fourth analog to digital converter receiving at least a portion of the output signal of the feed forward amplifier and converting the at least a portion of the output signal to a digitized output signal, the digital signal processor further receiving the digitized output signal and the digitized amplified error signal and generating the digitized error signal partially in response thereto.

3. A digital signal processing based feed forward amplifier as defined by claim 2, which further comprises:
   a filter circuit, the filter circuit being interposed between the digital to analog converter and the error amplifier, and receiving the analog error signal and filtering the same to generate a filtered analog error signal, the error amplifier being responsive to the filtered analog error signal and amplifying the same to generate the amplified error signal.

4. A digital signal processing based feed forward amplifier as defined by claim 2, which further comprises:
   a frequency down converter, the frequency down converter receiving the at least second portion of the input signal and down converting the frequency thereof to a frequency which is compatible to the first analog to digital converter and generating a down converted input signal, the first analog to digital converter being responsive to the down converted input signal and generating the digitized input signal in response thereto; and
   a frequency up converter, the frequency up converter receiving the analog error signal and up converting the frequency thereof to a frequency range corresponding to that of the input signal and generating an up converted error signal in response thereto, the error amplifier being responsive to the up converted error signal and amplifying the up converted error signal to generate the amplified error signal.

5. A digital signal processing based feed forward amplifier as defined by claim 4, which further comprises:
a filter circuit, the filter circuit being interposed between the frequency up converter and the error amplifier, and receiving the up converted error signal and filtering the same to generate a filtered up converted error signal, the error amplifier being responsive to the filtered up converted error signal and amplifying the same to generate the amplified error signal.

6. A digital signal processing based feed forward amplifier as defined by claim 2, which further comprises:
a pre-distortion circuit, the pre-distortion circuit being interposed between the digital to analog converter and the error amplifier, and receiving the analog error signal and pre-distorting the same to generate a pre-distorted analog error signal, the error amplifier being responsive to the pre-distorted analog error signal and amplifying the same to generate the amplified error signal; and
a fifth analog to digital converter, the fifth analog to digital converter receiving at least a second portion of the amplified error signal and converting the at least second portion of the amplified error signal to generate a digitized amplified error signal, the pre-distortion circuit being responsive to the digitized amplified error signal to adjust the pre-distortion of the analog error signal.

7. A digital signal processing based feed forward amplifier as defined by claim 2, wherein the digital signal processor includes:
a first parameter adjusting circuit, the first parameter adjusting circuit receiving the digitized input signal and generating an adjusted digitized input signal in response thereto which corresponds to the input signal adjusted in amplitude, phase and delay;
a main amplifier transfer function duplication circuit, the main amplifier transfer function duplication circuit receiving the digitized input signal and the digitized main amplified signal and generating a duplication circuit output signal in response thereto;
a first correlation circuit, the first correlation circuit being responsive to the duplication circuit output signal and the adjusted digitized input signal and correlating the duplication circuit output signal with the adjusted digitized input signal and generating a first correlation signal to control the amplitude, phase and delay of the adjusted digitized input signal;
a subtraction circuit, the subtraction circuit being responsive to the output signal of the transfer function duplication circuit and the adjusted digitized input signal and subtracting the adjusted digitized input signal from the duplication circuit output signal to generate a preliminary digitized error signal;
a second parameter adjusting circuit, the second parameter adjusting circuit being responsive to the preliminary digitized error signal and the digitized output signal and adjusting the amplitude, phase and delay of the preliminary digitized error signal to generate an adjusted preliminary error signal, the digital to analog converter being responsive to the adjusted preliminary error signal and generating the analog error signal in response thereto.

8. A digital signal processing based feed forward amplifier as defined by claim 7, wherein the digital signal processor further includes:
a finite impulse response (FIR) equalizer, the FIR equalizer being responsive to the adjusted preliminary error signal and equalizing the same to generate an FIR equalized error signal, the digital to analog converter being responsive to the FIR equalized error signal and generating the analog error signal in response thereto.

9. A feed forward amplification method using digital signal processing, which comprises the steps of:
delaying a first portion of an input signal and generating a delayed input signal thereby;
converting a second portion of the input signal from an analog signal to a digitized input signal;
amplifying the delayed input signal and generating a main amplified signal thereby, the main amplified signal having a signal component and a noise and distortion component;
converting at least a portion of the main amplified signal from an analog signal to a digitized main amplified signal;
digitally processing the digitized input signal and the digitized main amplified signal and generating a digitized error signal thereby;
converting the digitized error signal to an analog error signal;
amplifying the analog error signal to generate an amplified error signal thereby, the amplified error signal having a noise and distortion component which is substantially the same in magnitude as the noise and distortion component of the main amplified signal;
combining the amplified error signal and the main amplified signal such that the noise and distortion component of the amplified error signal is subtracted from the noise and distortion component of the main amplified signal, thereby leaving substantially only the amplified signal component remaining in the amplified input signal, and outputting the amplified input signal as an output signal as a result of the feed forward amplification method;
converting at least a portion of the amplified error signal from an analog signal to a digitized amplified error signal; and
converting at least a portion of the output signal resulting from the feed forward amplification method from an analog signal to a digitized output signal, the digital processing step further generating the digitized error signal in response to the digital processing of the digitized output signal and the digitized amplified error signal.

* * * * *